(12) United States Patent
Teene

(10) Patent No.: US 6,854,103 B2
(45) Date of Patent: Feb. 8, 2005

(54) APPARATUS AND METHOD FOR VISUALIZING AND ANALYZING RESISTANCE NETWORKS

(75) Inventor: Andres Robert Teene, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 67 days.

(21) Appl. No.: 10/331,521

(22) Filed: Dec. 30, 2002

(65) Prior Publication Data

US 2004/0128637 A1 Jul. 1, 2004

(51) Int. Cl.⁷ .............................................. G06F 17/50
(52) U.S. Cl. ............................... 716/11; 2/14; 713/401
(58) Field of Search ............................ 716/2, 4, 11, 19

(56) References Cited

U.S. PATENT DOCUMENTS 6,751,744 B1 * 6/2004 Allen et al. ................. 713/401
2001/0029601 A1 * 10/2001 Kimura et al. ................ 716/19

* cited by examiner

Primary Examiner—Thuan Do
(74) Attorney, Agent, or Firm—Yee & Associates, P.C.

(57) ABSTRACT

An apparatus and method for automatically generating a visual representation of a resistance network and an equivalent point to point resistance for any set of terminals on the resistance network are provided. With the apparatus and method, a cell layout is input to a resistance/capacitance (RC) extraction tool. The RC extraction tool extracts the RC parasitics from the cell layout and inputs them into a resistance network visualization and analysis tool. From the RC parasitics, a graph data structure representation of the resistance network is generated. The graph data structure of the resistance network may then be reduced using, for example, a single layer series and parallel reduction, all layers series and parallel reduction, layer specific reduction, or the like. Following reduction, if any, a visual representation of the resistance network is generated using the graph data structure. Thereafter, equivalent point to point resistance for any set of terminals on the resistance network may be generated. The point to point resistance may be used for detailed analysis and verification of the extracted parasitics. The equivalent resistance is calculated using mesh and matrix analysis based on the graph data structure representation of the resistance network.

25 Claims, 16 Drawing Sheets

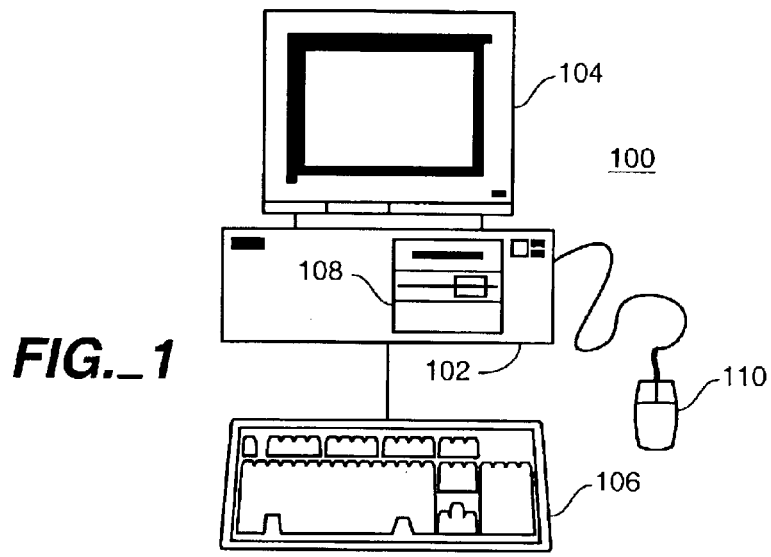
FIG._1
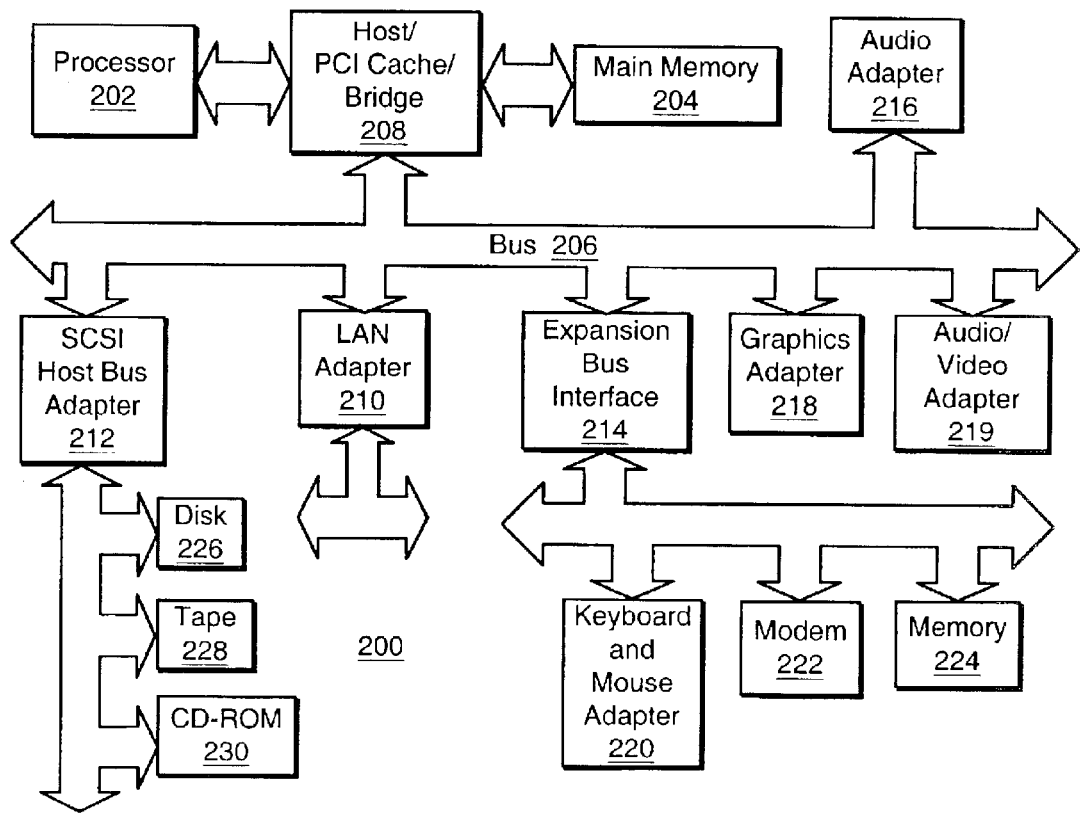
FIG._2

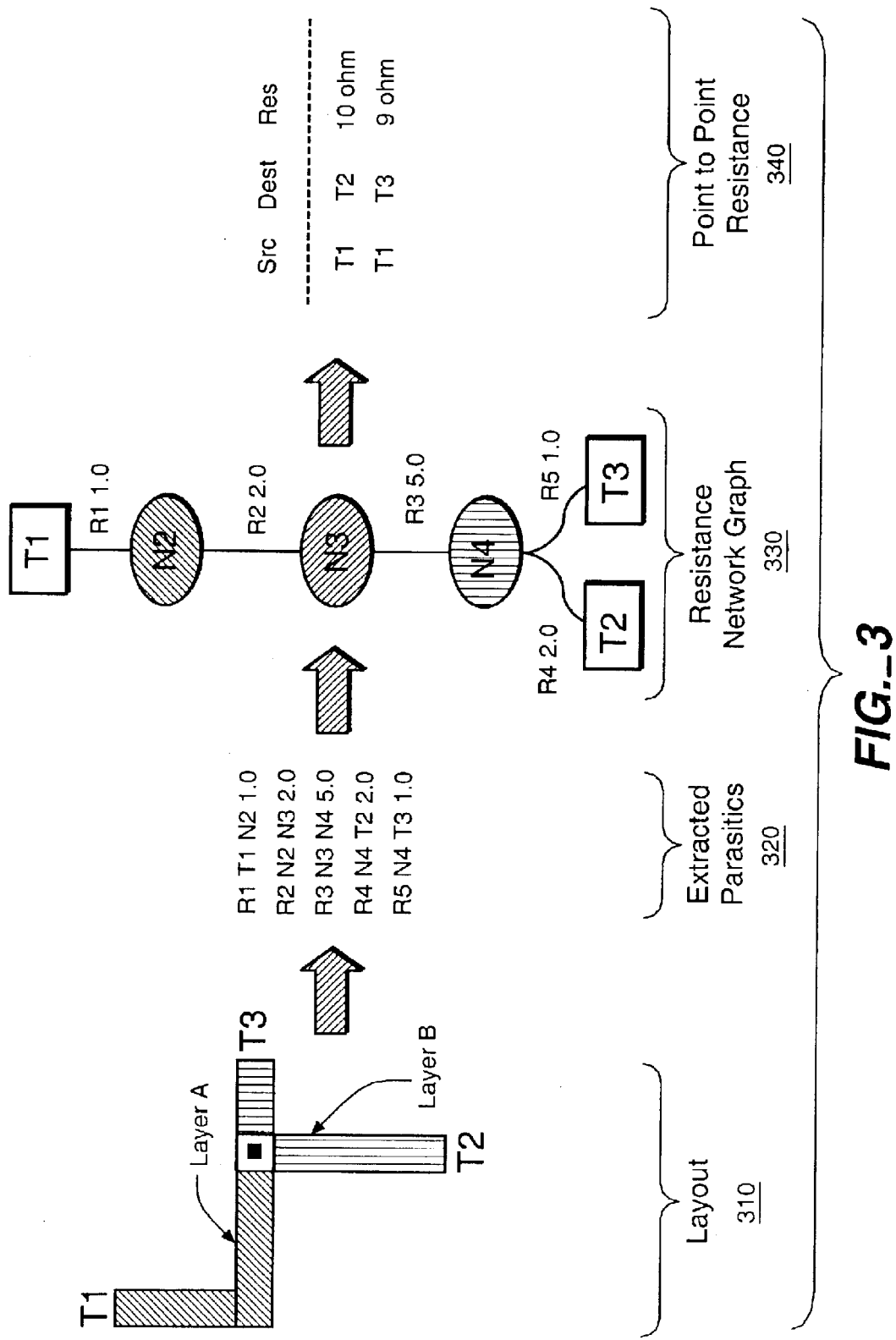
FIG._3

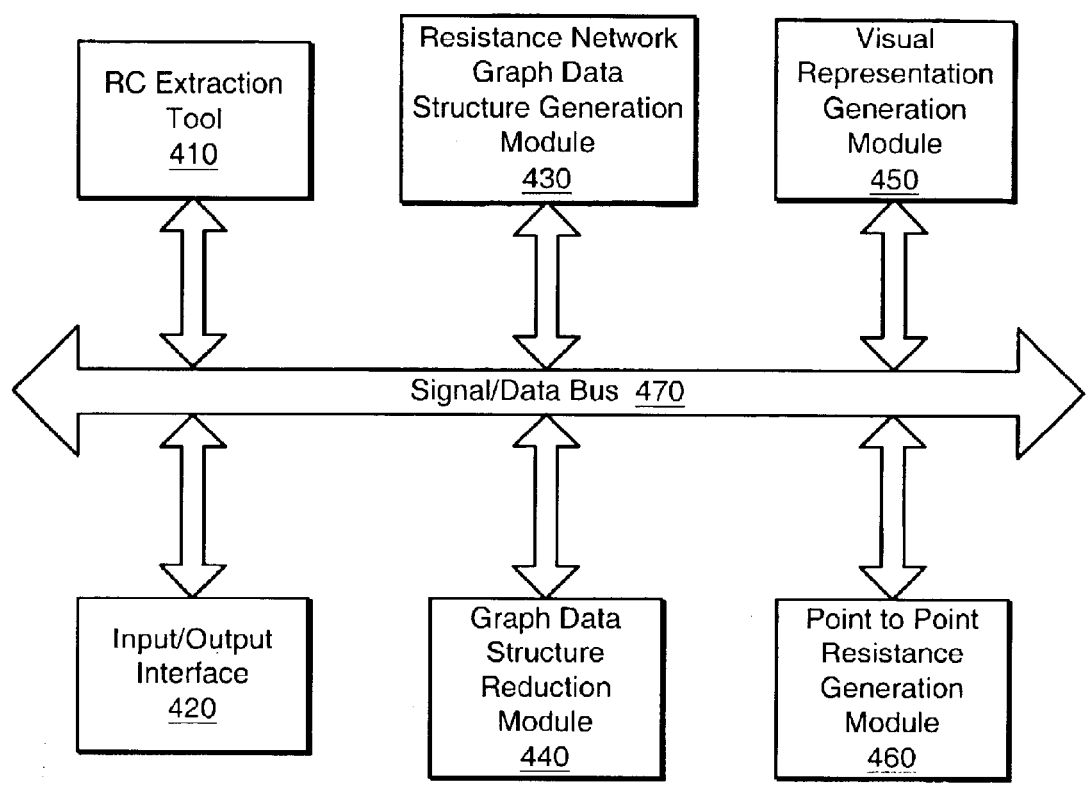
FIG._4

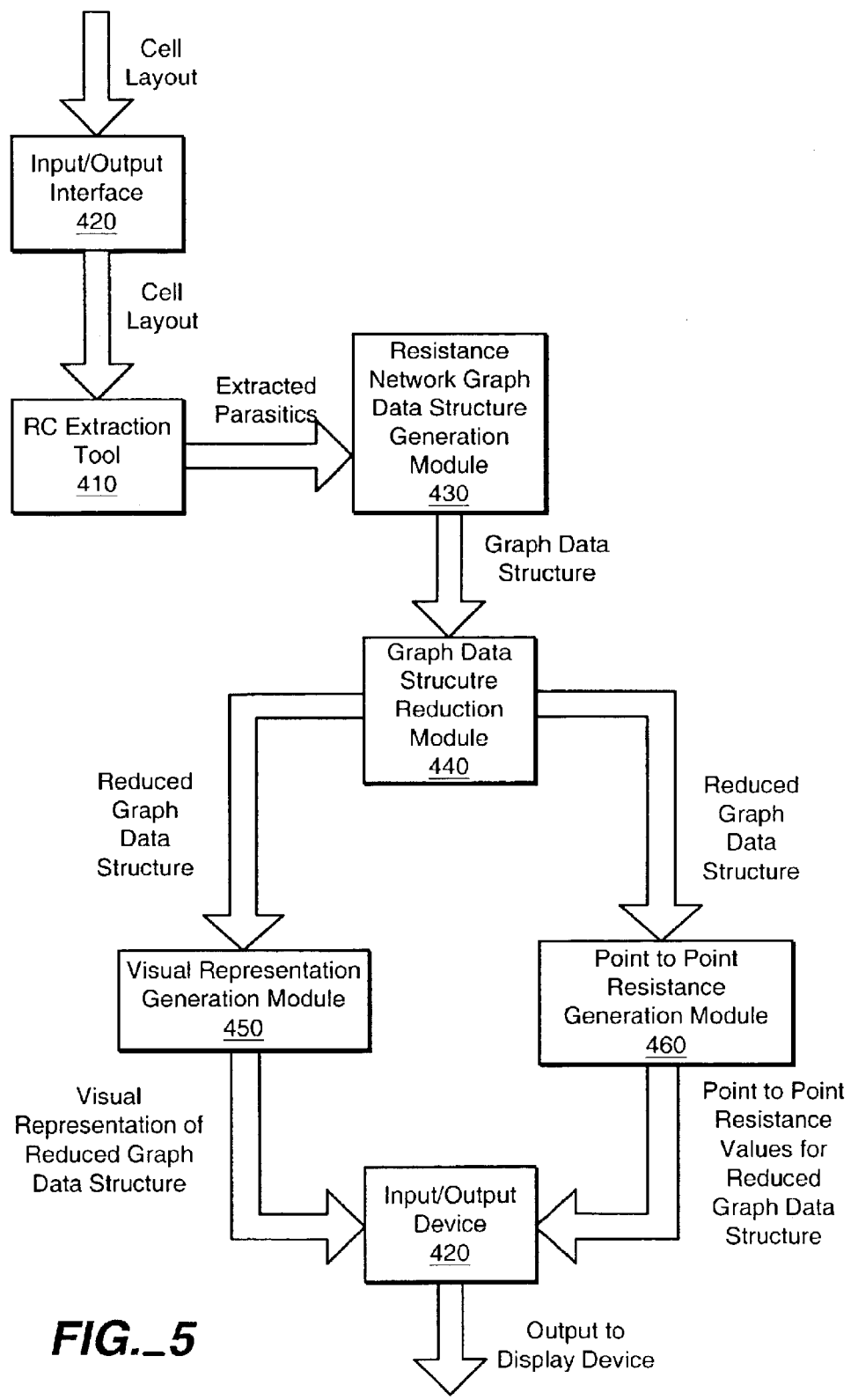
FIG._5

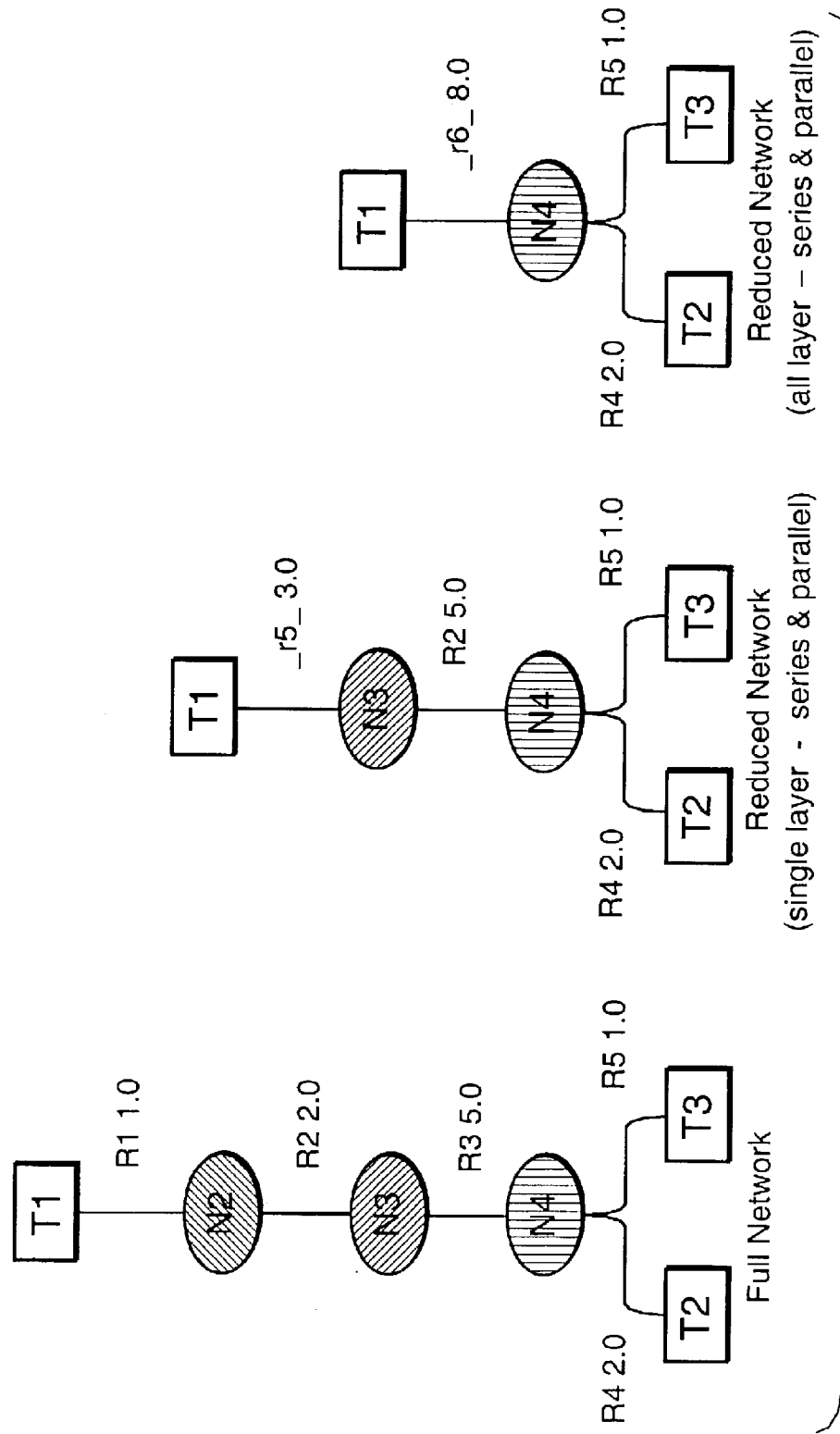
FIG._6

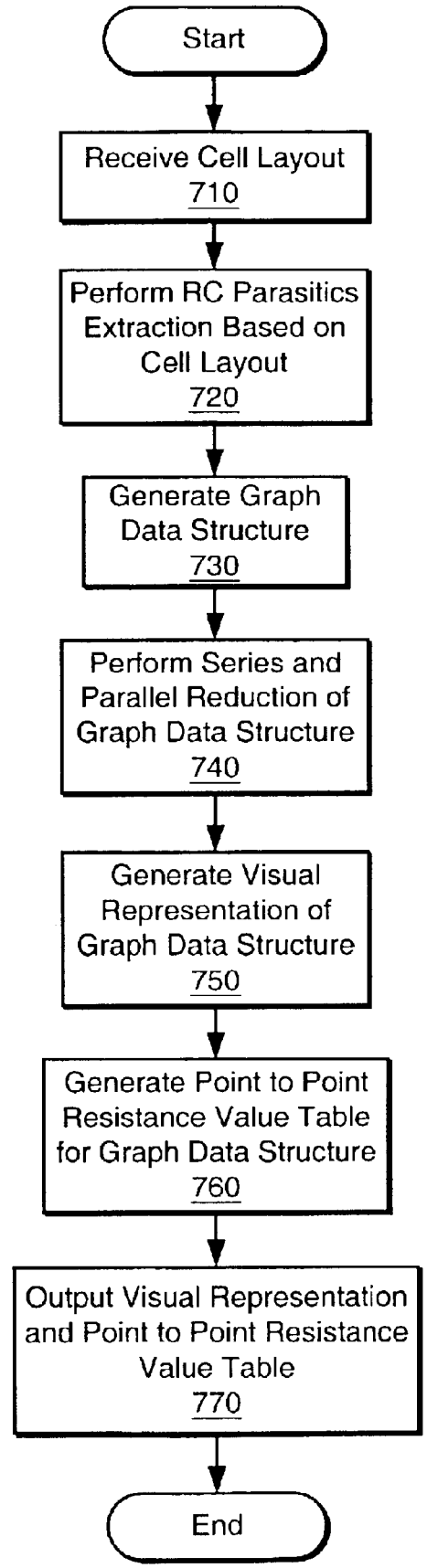
FIG._ 7

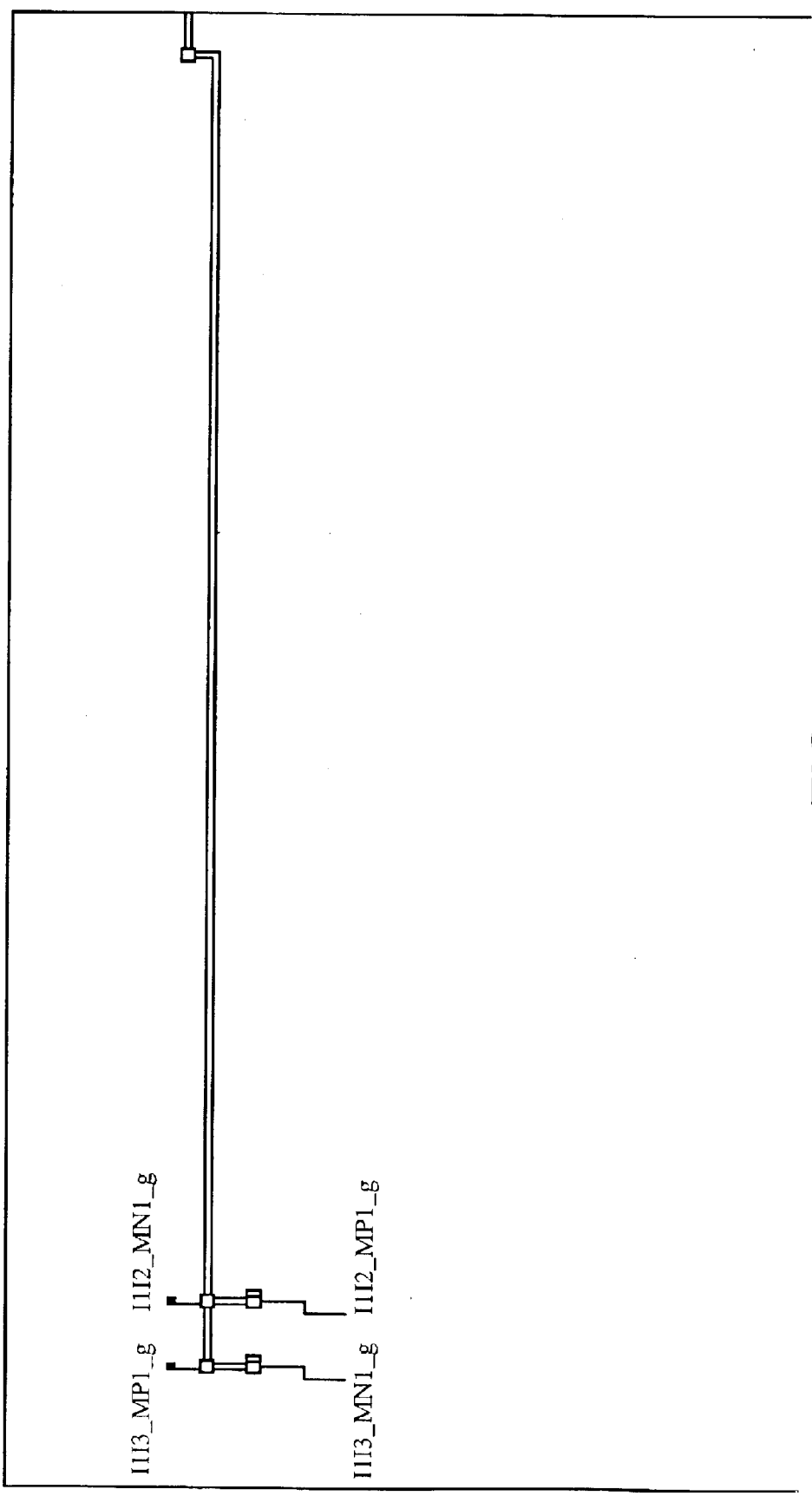
FIG._8

```
.subckt ENB 1I2.MN1_G 1I2.MP1_G 1I3.MN1_G 1I3.MP1_G ENB
R1 3 4 5.142858E+00
R2 1I2.MN1_G 4 2.571429E+00
R3 6 7 5.142858E+00
R4 1I3.MN1_G 7 2.571429E+00
R5 10 11 1.514286E+01
R6 10 8 2.571429E+00
R7 13 1I2.MP1_G 5.546916E+00
R8 13 11 3.879139E+00
R9 13 12 5.080007E-03
R10 16 17 1.514286E+01
R11 16 14 2.571429E+00
R12 19 1I3.MP1_G 5.546916E+00
R13 19 17 3.879139E+00
R14 19 18 5.080007E-03
R15 8 1I2.MN1_G 5.714286E-01
R16 14 1I3.MN1_G 5.714286E-01
R17 20 1I2.MP1_G 5.714286E-01
R18 21 1I3.MP1_G 5.714286E-01
R19 ENB 27 2.048870E-01
R20 28 29 3.916958E-01
R21 28 30 6.715665E-02
R22 29 31 6.715665E-02
R23 32 33 3.916958E-01
R24 32 34 6.715665E-02
R25 33 35 6.715665E-02
R26 27 36 6.684612E-02
R27 37 38 1.749976E+01
R28 39 40 1.018409E+00
R29 42 38 5.976679E-02
R30 42 39 5.976679E-02
R31 42 41 0.000000E+00
R32 40 43 6.684612E-02
R33 44 37 1.254356E-01
R34 44 45 6.715665E-02
R35 22 24 4.000000E+00
R36 23 25 4.000000E+00
R37 24 30 4.500000E+00
R38 25 34 4.500000E+00
R39 31 41 4.500000E+00
R40 35 43 4.500000E+00
R41 36 45 4.500000E+00
R42 12 22 1.446429E+01
R43 12 22 1.500000E+01
R44 12 22 1.472727E+01
R45 18 23 1.446429E+01
R46 18 23 1.500000E+01
R47 18 23 1.472727E+01
.ends
```

FIG._9

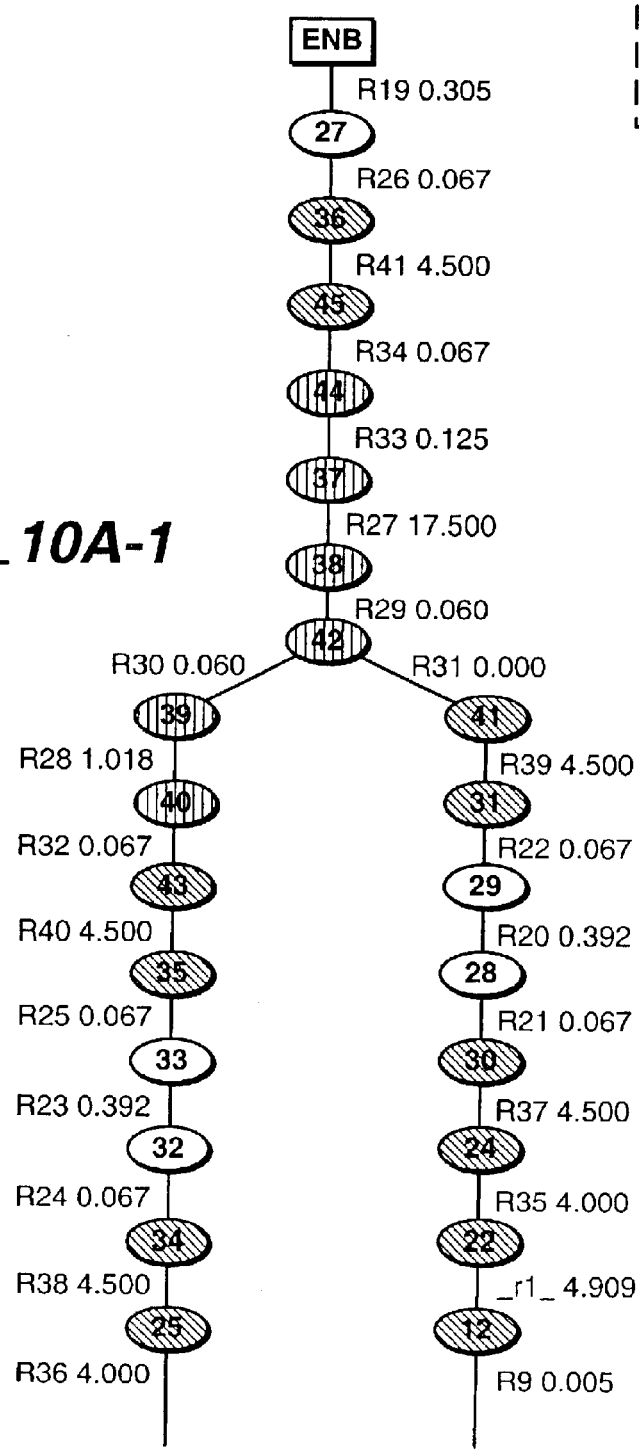
FIG._10A
Full Network
FIG._10A-1

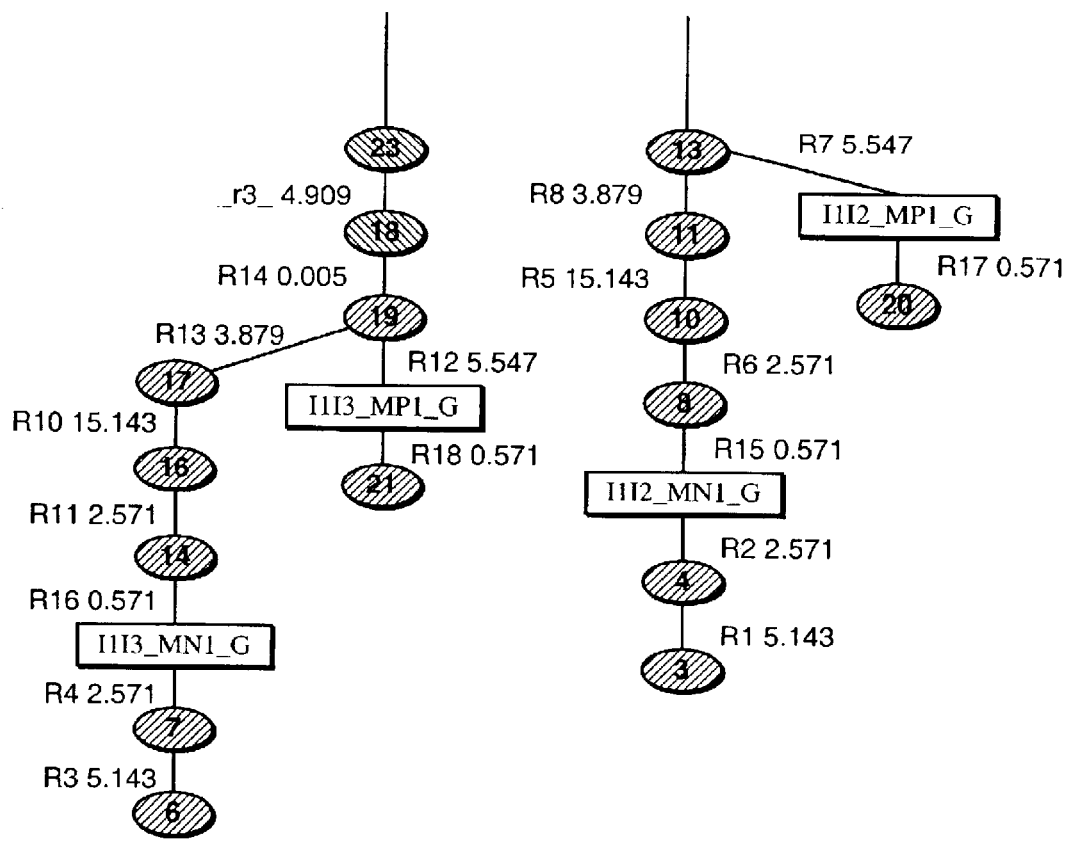
FIG._10A-2

Reduced Network
(single layer – series & parallel)

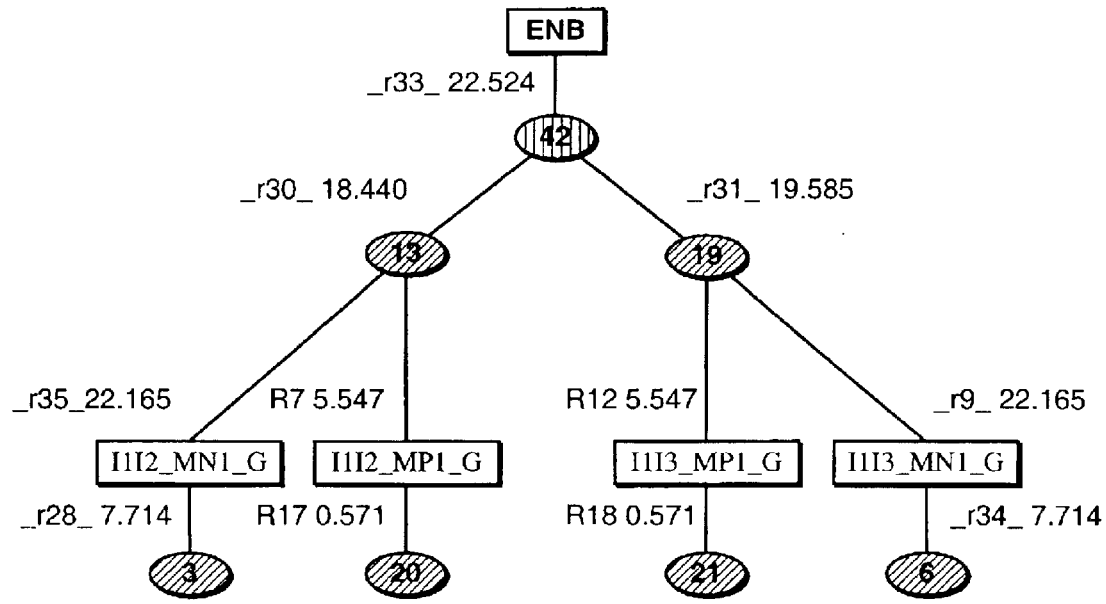
FIG._10C
Reduced Network
(single layer - series & parallel)
```
# Net ENB

# Source      Destination   Resistance
# --------------------------------------
  ENB         1I2_MN1_G     63.129 ohm
  ENB         1I2_MP1_G     46.511 ohm
  ENB         1I3_MP1_G     64.274 ohm
  ENB         1I3_MN1_G     47.656 ohm
```
FIG._11

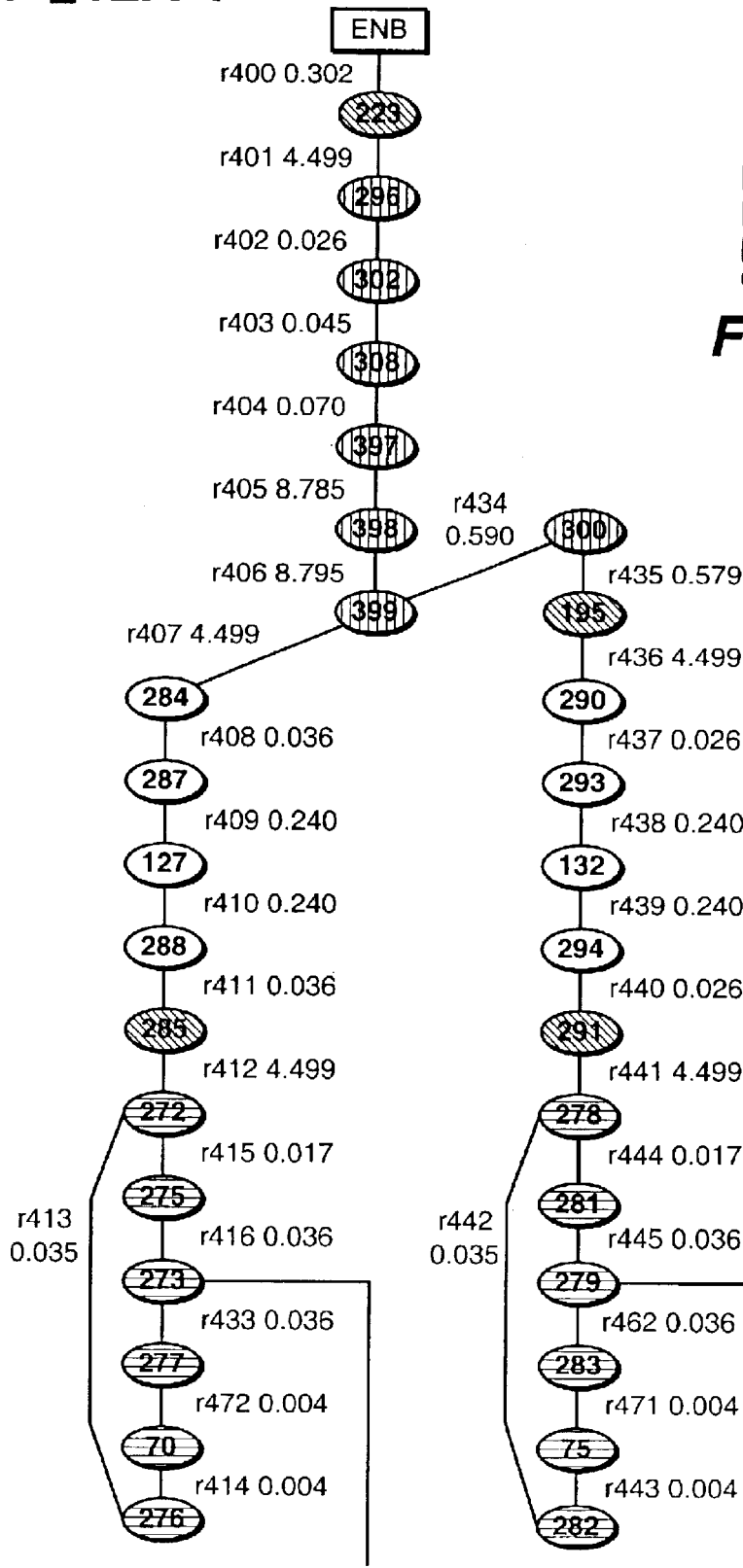
FIG._12A-1
FIG._12A-2
FIG._12A

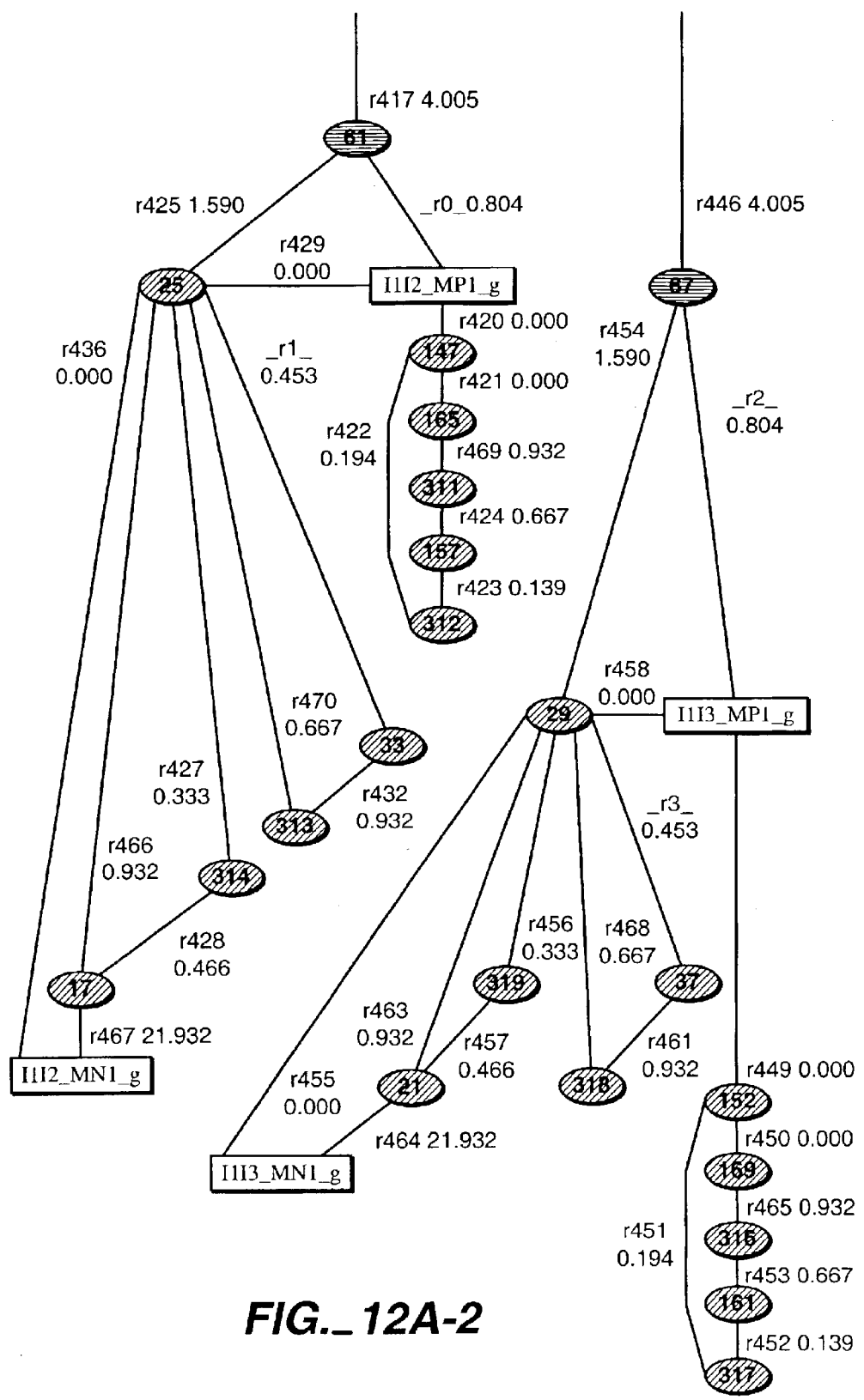
FIG._12A-2

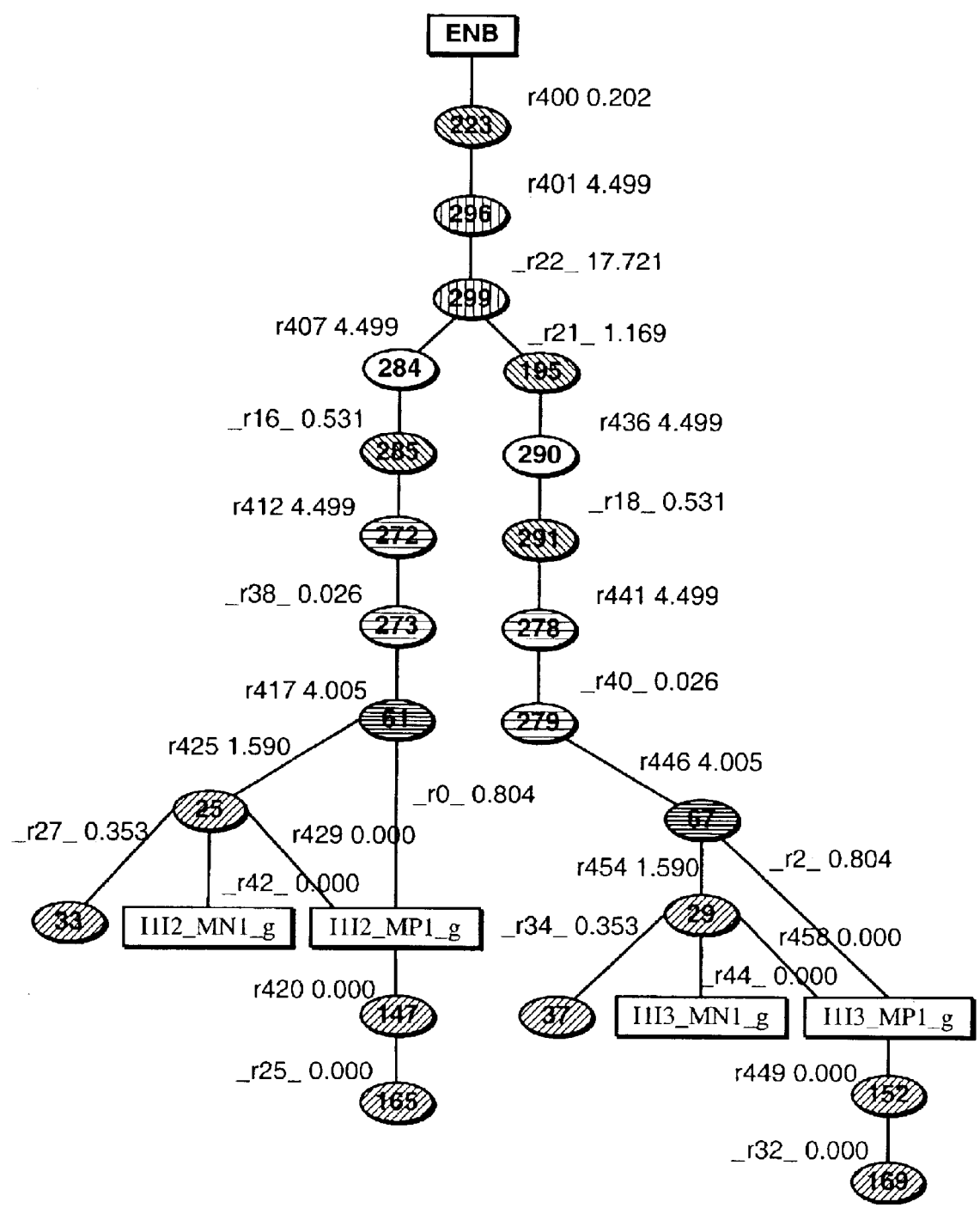
FIG._12B
Reduced Network
(Single Layer-series & Parallel)

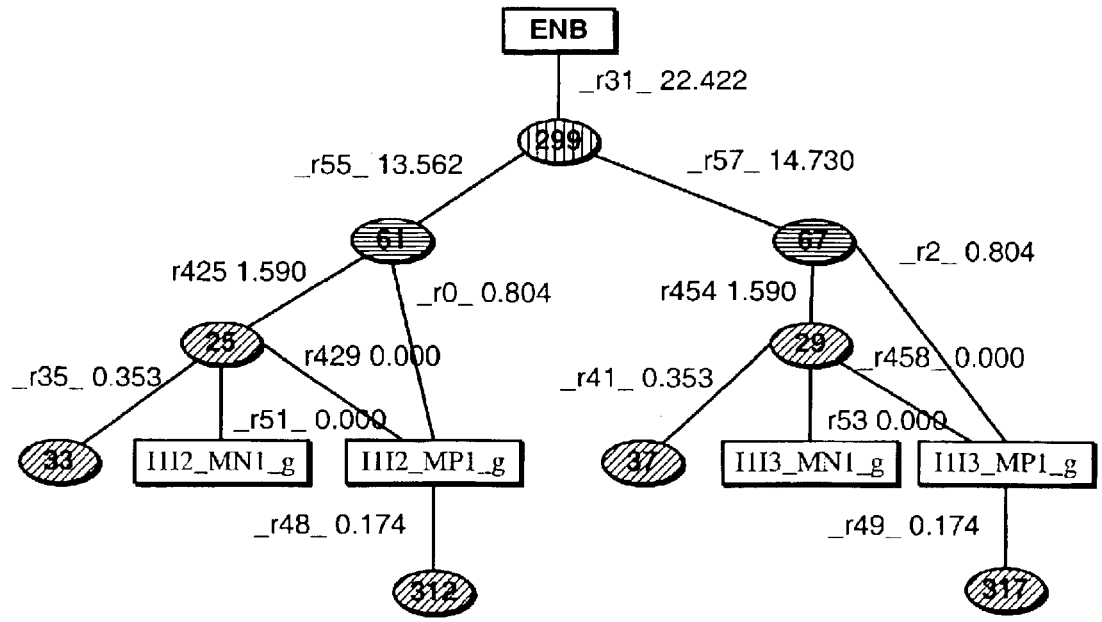
FIG._12C
Reduced Network
(All Layer- series & Parallel)
```
# Net ENB

# Source      Destination   Resistance
# -------------------------------------
  ENB         1I2_MN1_g     36.518 ohm
  ENB         1I2_MP1_g     36.518 ohm
  ENB         1I3_MN1_g     37.687 ohm
  ENB         1I3_MP1_g     37.687 ohm
```
FIG._13

APPARATUS AND METHOD FOR VISUALIZING AND ANALYZING RESISTANCE NETWORKS

BACKGROUND OF THE INVENTION

1. Technical Field

The present invention is directed to an apparatus and method visualizing and analyzing resistance networks. More specifically, the present invention is directed to a mechanism for automatically generating a visual representation of a resistance network to facilitate visual verification and a mechanism for automatically generating equivalent point to point resistance.

2. Description of the Related Art

Resistance/capacitance (RC) parasitic extraction of cell and interconnect structures is an essential part of the integrated circuit design and verification process. The extracted RC parasitics are used for a number of different applications including delay, power drop, and electromigration analysis. Accurate resistance extraction is essential for these applications.

The extracted RC parasitics for individual nets in an integrated circuit can be very complex with hundreds or thousands of individual resistor and capacitor components. There are a number of tools, such as QuickCap available from Random Logic Corporation, that are used for the verification of accuracy of extracted capacitance.

Currently, the verification of the accuracy of the extracted resistance networks is very difficult and not generally done. If it is done at all, the analysis and verification of extracted resistance networks is performed manually. However, as more and more elements are integrated into smaller areas, the complexity of the corresponding extracted resistance networks makes it very difficult to manually verify the extracted results.

Thus, it would be beneficial to have an apparatus and method for automatically generating a visual representation of a resistance network that facilitates visual verification by a user. Moreover, it would be beneficial to have an apparatus and method for automatically generating equivalent point to point resistance for use in verifying the extracted resistances.

SUMMARY OF THE INVENTION

The present invention provides an apparatus and method for automatically generating a visual symbolic representation of a resistance network and an equivalent point to point resistance for any set of terminals on the resistance network. With the apparatus and method of the present invention, a cell layout is input to a resistance/capacitance (RC) extraction tool. The RC extraction tool extracts the RC parasitics from the cell layout and inputs them into a resistance network visualization and analysis tool.

From the RC parasitics, a graph data structure representation of the resistance network is generated. The graph data structure of the resistance network may then be reduced using, for example, a single layer series and parallel reduction, all layers series and parallel reduction, layer specific reduction, or the like. Following reduction, if any, a visual representation of the resistance network is generated using the graph data structure.

Thereafter, equivalent point to point resistance for any set of terminals on the resistance network may be generated. The point to point resistance may be used for detailed analysis and verification of the extracted parasitics. The equivalent resistance is calculated using mesh and matrix analysis based on the graph data structure representation of the resistance network.

These and other features will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is an exemplary diagram of a computing device in which the present invention may be implemented;

FIG. 2 is an exemplary block diagram of the primary operational components of a computing device in which the present invention may be implemented;

FIG. 3 is an exemplary diagram illustrating the process for generating a resistance network graph visual representation and point to point resistance;

FIG. 4 is an exemplary block diagram of the primary operational components of a resistance network visualization and analysis tool according to the present invention;

FIG. 5 is a data flow diagram illustrating an exemplary operation of the present invention;

FIG. 6 is a diagram illustrating series and parallel reduction of a graph data structure representation of a resistance network in accordance with the present invention;

FIG. 7 is a flowchart outlining an exemplary operation of the present invention;

FIG. 8 is a diagram of the physical layout of an example net, i.e. an ENB net, for illustrating an example application of the present invention;

FIG. 9 is a netlist of extracted resistance obtained using a first extraction tool;

FIGS. 10A–10C are diagrams illustrating the graph visual representation generated by the present invention for both the full and reduced netlist;

FIG. 11 is an example table of point to point resistances for sets of terminals in the graph data structure of the resistance network shown in FIGS. 10A–10C;

FIGS. 12A–12C are diagrams illustrating the graph visual representations generated by the present invention for both the full and reduced netlists based on extracted values obtained from a second extraction tool; and FIG. 13 is an example table of point to point resistances for sets of terminals in the graph data structure of the resistance network shown in FIGS. 12A–12C.

DETAILED DESCRIPTION

Figure 10B:
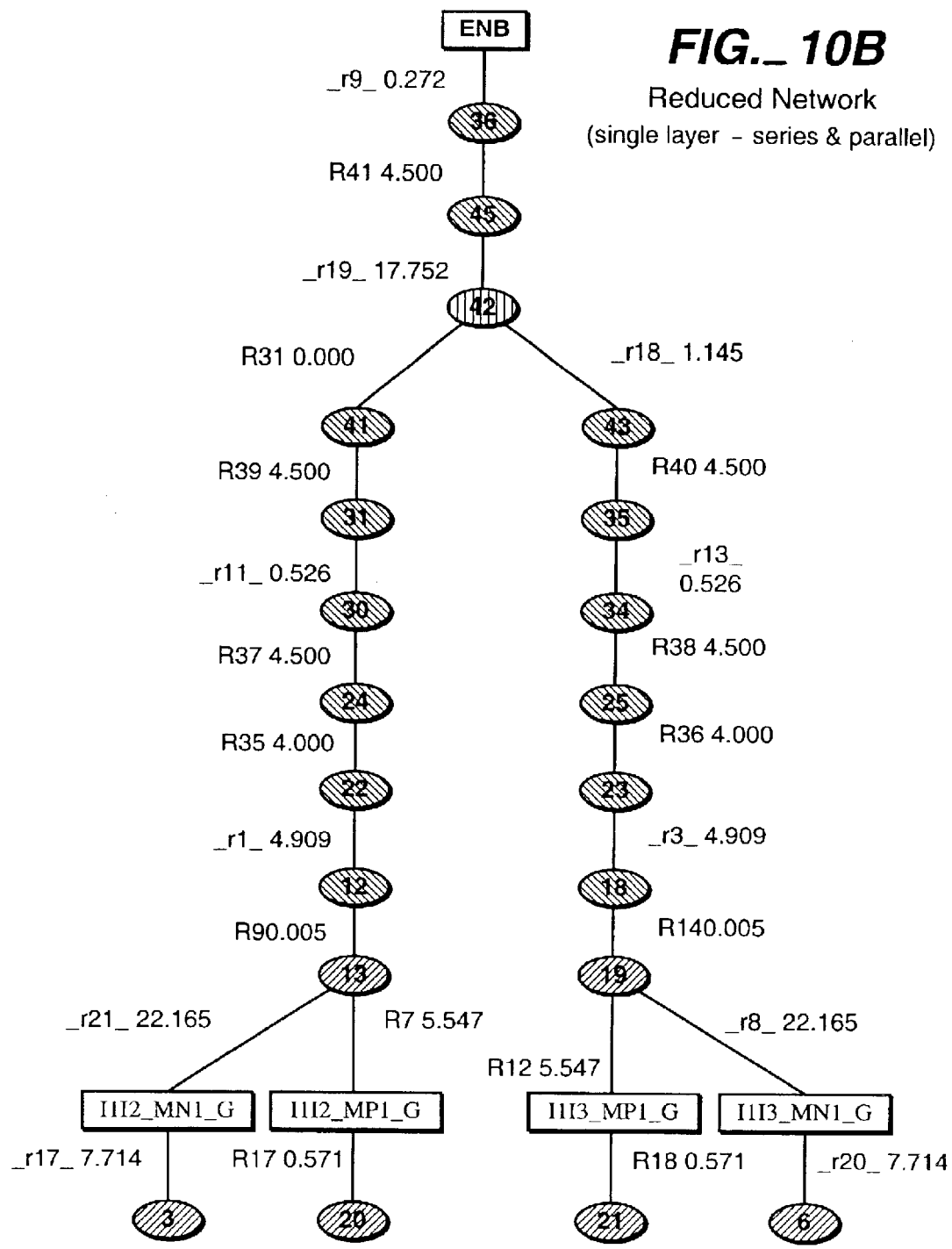

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and in particular with reference to FIG. 1, a pictorial representation of a data processing system in which the present invention may be implemented is depicted in accordance with a preferred embodiment of the present invention. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows XP, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226-230.

As previously stated above, the present invention provides a mechanism for aiding in the visualization and analysis of resistance networks. The mechanism of the present invention automatically generates a visual representation of a resistance network and an equivalent point to point resistance for any set of terminals on the resistance network. With the apparatus and method of the present invention, a cell layout is input to a resistance/capacitance (RC) extraction tool. The RC extraction tool extracts the RC parasitics from the cell layout and inputs them into a resistance network visualization and analysis tool.

From the RC parasitics, a graph data structure representation of the resistance network is generated. The resistance graph consists of nodes and arcs. The arcs represent the resistors and have attributes that include the resistance value, interconnect layer and name (the name corresponds to the resistor identifier in the netlist). The nodes represent the resistor connection. The graph terminals are the resistor network inputs and outputs, these are either device terminals or input/output pins.

The graph data structure representation of the resistance network is generated by first reading the RC parasitics netlist. A determination is made for each resistor connection of each resistor in the netlist as to whether this connection is new to the graph data structure or not. If the connection is new, then a node is added to the graph data structure. The node that is added is a source terminal if the connection is an input port or transistor source/drain. The node that is added is a destination terminal if the connection is an output port or a transistor gate. Thereafter, an arc from the previous node to this new node is generated that includes the resistance value, interconnect layer and name as attributes.

The graph data structure of the resistance network may then be reduced using, for example, a single layer series and parallel reduction, all layers series and parallel reduction, layer specific reduction, or the like. Series reduction is performed by scanning all the nodes in the graph data structure and determining if any node has two and only two arc connections and both arcs have the same layer attribute or all layer reduction option is specified. If so, then the node is deleted and the two arcs are replaced with a single arc whose resistance value is the sum of the resistance of the replaced arcs.

With parallel reduction, all the arcs in the graph data structure are scanned and a determination is made as to whether any two arcs have the same nodes and both arcs have the same layer attribute or all layer reduction option is specified. If so, the two arcs are replaced by a single arc whose resistance value is the product of the two resistance values for the two arcs divided by the sum of the resistance values of the two arcs.

For dangling node reduction, all the nodes of the graph data structure are scanned and a determination is made as to whether any non-terminal node has one and only one connection. If so, then the node and arc are deleted from the graph data structure. These reduction techniques are repeated until no more reduction is possible. The result is a fully reduced graph data structure.

Following reduction, if any, a visual representation of the resistance network is generated using the graph data structure. The visual representation of the resistance network is generated as a symbolic view of a graph generated from the graph data structure. This symbolic view may include nodes representing resistor connections, arcs between nodes representing resistors, labels identifying resistance values and names of elements (corresponding to netlist identifiers), and the like. Layers of the resistance network may be represented, for example, in various colors, shading, or any other distinguishing manner.

After the symbolic view of the graph data structure is generated, equivalent point to point resistance for any set of terminals on the resistance network may be generated. The point to point resistances may be calculated for all possible terminal pairs or specified pairs of terminals. The point to point resistance may be used for detailed analysis and verification of the extracted parasitics. The equivalent resistance is calculated using mesh and matrix analysis based on the graph data structure representation of the resistance network.

More specifically, the resistance network may have multiple source and destination terminals. A source terminal is either an input port or source/drain of a transistor. A destination terminal is either an output port or a gate of a transistor. There are two approaches to evaluate the equivalent point to point resistance. With the first approach, the resistance from a source to all the destination terminals is calculated. This approach gives an equivalent resistance for the overall network. With the second approach, the resistance from a source to a single destination terminal is calculated. This approach gives the resistance between the two terminals when all other terminals are "floating." This allows for better comparison of individual resistance paths within the resistance network.

Whether the first approach or the second approach is utilized, the following methodology may be used to calculate the resistance between a source and destination terminal(s). First a conductance matrix G is created where $G_{ii}$ is the sum of all conductance (1/R) connected to node i, and $G_{ij}$ is the sum of all conductance connected between nodes i and j. A 1 ohm resistor is then added to each destination terminal in the conductance matrix G: $G_{dd}=G_{dd}+1$ where d is the destination terminal. A current matrix I is then created where $I_s$ is 1 for the source terminal s and $I_i$ is 0 for all non source terminals i. The matrix equation V=I/G is then solved using the current matrix I and conductance matrix G. The source to destination resistance is then calculated as $R_{sd}=(V_s/V_d)-1$. For the second approach, this methodology is repeated for each source destination pair. This methodology may also be used to calculate point to point resistances between internal nodes in the resistance network.

FIG. 3 is an exemplary diagram illustrating the process for generating a resistance network graph visual representation and point to point resistance. As shown in FIG. 3, a cell layout 310 is obtained for a portion of an integrated circuit. The parasitics of the cell layout are extracted to generate an extracted parasitics data structure 320. The extracted parasitics data structure 320 is then used to generate a resistance network graph 330. The generation of the resistance network graph 330 may include reducing the graph as previously described above.

The resistance network graph is then used to generate point to point resistance values 340.

FIG. 4 is an exemplary block diagram of the primary operational components of a resistance network visualization and analysis tool according to the present invention. The elements shown in FIG. 4 may be implemented as hardware, software, or any combination of hardware and software without departing from the spirit and scope of the present invention. In a preferred embodiment, the elements shown in FIG. 4 are implemented as software instructions executed by one or more processors.

As shown in FIG. 4, the resistance network visualization and analysis device of the present invention includes a resistance/capacitance (RC) extraction tool 410, an input/output (IO) interface 420, a resistance network graph data structure generation module 430, a graph data structure reduction module 440, a visual representation generation module 450 and a point to point resistance generation module 460. The elements 410-460 are in communication with one another via the signal/data bus 470.

With the resistance network visualization and analysis device of FIG. 4, a cell layout is received via the IO interface 420 and provided to the RC extraction tool 410. The RC extraction tool 410 performs extraction on the cell layout to generate an extracted parasitics data structure. The extracted parasitics data structure is then provided to the resistance network graph data structure generation module 430 which generates a graph data structure representing a graph of the resistance network as defined by the extracted parasitics data structure.

The graph data structure may then be provided to the graph data structure reduction module 440. The graph data structure reduction module 440 performs series and parallel reduction on the graph data structure to generate a reduced graph data structure. The reduced graph data structure may then be provided to the visual representation generation module 450 and the point to point resistance generation module 460. The visual representation generation module 450 generates a visual representation of the reduced graph data structure using nodes, boxes and arcs. The boxes represent terminals in the resistance network. The nodes represent nodes between resistance elements. The arcs represent the resistance elements. In addition, the nodes may be shaded to represent various layers of the resistance network and labeled to identify the elements in the original extracted parasitics data structure. Moreover, the resistance elements may be labeled for identification purposes with regard to the extracted parasitics data structure and may also have their associated resistance values displayed.

The point to point resistance generation module 460 generates a table of point to point resistance values for any set of terminals in the reduced graph data structure. This table may be generated automatically for every combination of two terminals present in the reduced graph data structure. Alternatively, a user may input parameters identifying the sets of terminals of interest and the point to point resistance generation module may generate resistance values for only the designated sets of terminals.

It should be noted that the reduction performed by the graph data structure reduction module 440 is optional and may not be used in some cases. Thus, rather than providing the graph data structure to the graph data structure reduction module 440, the present invention may provide the graph data structure directly to the visual representation generation module 450 and the point to point resistance generation module 460.

FIG. 5 is a data flow diagram illustrating an exemplary operation of the present invention. As shown in FIG. 5, a cell layout is received via the input/output interface 420 and provided to the RC extraction tool 410. The RC extraction tool 410 extracts parasitic values from the cell layout and stores them in an extracted parasitics data structure that is provided to the resistance network graph data structure generation module 430. The resistance network graph data structure generation module 430 generates a graph data structure and (optionally) provides the graph data structure to the graph data structure reduction module 440.

The graph data structure reduction module 440 reduces the graph data structure using series and parallel reduction, to thereby generate a reduced graph data structure. The reduced graph data structure is provided to both the visual representation generation module 450 and the point to point resistance generation module 460. The visual representation generation module 450 generates a visual representation of the reduced graph data structure and outputs it via the input/output interface 420 to a display device. The point to point resistance generation module 460 generates point to point values for terminals of the reduced graph data structure and outputs them via the input/output interface 420 to the display device.

Thus, with the present invention, a graphical representation of the resistance network of a cell layout is generated that may be used to visually verify the results of a parasitic extraction tool. The graphical representation of the resistance network provides both a simple and detailed symbolic representation of the resistance network that provides significant insight into the physical structure of the network.

Moreover, the point to point resistance values generated by the present invention may be used to verify and compare the extracted results against any given reference. Thus, for example, the point to point resistance values may be used to compare the extraction results from two or more different RC extraction tools to determine which tools provide the best results.

In other words, the combination of the symbolic view of the graph of the resistance network and the point to point resistance values enables the user to verify the parasitic extraction. For example, the present invention allows a visual comparison between the physical layout and symbolic view generated by the present invention. The symbolic view of the graph can be used to easily trace the physical layout and identify the individual resistor components in the layout. The point to point resistance values can be used to compare the results between two methods of extraction results. Moreover, the point to point resistance values can be used to compare the extraction results to the known resistance of specific structures that can be theoretically calculated or measured.

As noted above, the present invention provides a mechanism for reducing the graph data structure using series and parallel reduction techniques. These techniques may be performed on a single layer of the cell layout, multiple layers, all layers, or a specifically designated layer or layers. FIG. 6 is a diagram illustrating series and parallel reduction of a graph data structure representation of a resistance network in accordance with the present invention. The present invention may make use of such series and parallel reduction of the graph of the resistance network in order to provide a more simplified graph for use in visual verification by a user of the extraction results with the cell layout.

FIG. 7 is a flowchart outlining an exemplary operation of the present invention. As shown in FIG. 7, the operation starts with receiving a cell layout (step 710). Extraction of RC parasitics is then performed based on the cell layout (step 720). A graph data structure is then generated based on the extracted RC parasitics (step 730). Optionally, series and parallel reduction of the graph data structure may be performed (step 740). A visual representation of the graph data structure is then generated (step 750) and a point to point resistance value table is generated for the graph data structure (step 760). The visual representation and point to point resistance value table are then output (step 770).

FIG. 8 is a diagram of the physical layout of an example net, i.e. an ENB net, for illustrating an example application of the present invention. FIG. 9 is a netlist of extracted resistance for the cell layout of FIG. 8, obtained using a first extraction tool. The particular netlist shown in FIG. 9 was generated using the Arcadia extraction tool, available from Synopsys. This netlist is then used to generate the graphs shown in FIGS. 10A–10C.

FIGS. 10A–10C are diagrams illustrating the graph visual representation generated by the present invention for both the full and reduced netlist generated using the Arcadia extraction tool. FIG. 11 is a point to point resistance value table generated from the all layer reduced network graph of FIGS. 10A–C. The diagrams shown in FIGS. 10A–10C and 11 are best understood with reference to FIGS. 12A–12C and 13 that illustrate a different graph of extracted parasitic values for a different extraction tool, i.e. the xCalibre extraction tool. That is, FIGS. 12A–12C illustrate the full and reduced graphs of the ENB cell layout as generated from parasitic values extracted from the cell layout using the xCalibre extraction tool. It can be seen through a comparison of FIGS. 10A–10C and 12A–12C that the two extraction tools result in different graphs being generated. Moreover, through a comparison of the point to point resistance tables in FIGS. 11 and 13, it can be seen that there is a significant difference in the extraction results between the two tools. Analysis of the symbolic views of the graphs can be used to identify where the differences occur.

Thus, the above described invention provides a mechanism for generating a visual representation of a resistance network for aiding a user in verifying the extracted parasitics obtained from a cell layout. In addition, the present invention provides a mechanism for generating point to point resistance values for sets of terminals in the cell layout so as to provide a more detailed verification tool. With the present invention, not only may the results of an extraction tool be compared against the original cell layout to verify the results, but results from different extraction tools may be compared to one another to identify differences between their extracted results.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system, for generating a visual representation of a resistance network, comprising:

receiving a cell layout for the resistance network;

extracting a resistance parasitics netlist from the cell layout;

generating a graph data structure from the resistance parasitic netlist; and generating a visual representation of the graph data structure, wherein the visual representation includes graphical representations of terminals, graphical representation of nodes between resistance elements, and are representing the resistance elements.

2. The method of claim 1, further comprising:

reducing the graph data structure generated from the resistance parasitic values.

3. The method of claim 2, wherein reducing the graph data structure includes performing at least one of series and parallel reduction on the graph data structure for one or more layers of the cell layout.

4. The method of claim 1, wherein the graphical representations of nodes between resistance values include shading or coloring, and wherein the shading or coloring is representative of a layer of the node in the call layout.

5. The method of claim 1, wherein the arcs have displayed attributes that include a resistance value and a name that corresponds to a resister element in the resistance parasitic netlist.

6. A method in a data processing system for generating a visual representation of a resistance network, comprising:

receiving a cell layout for the resistance network;

extracting a resistance parasitic netlist from the cell layout;

generating a graph data structure from the resistance parasitic netlist;

generating a visual representation of the graph data structure: and generating a point to point resistance value table that stores resistance values for sets of terminals in the cell layout.

7. The method of claim 6, wherein generating a point to point resistance value table includes generating resistance values for each possible pair of terminals in the cell layout.

8. The method of claim 6, wherein generating a point to point resistance value table includes generating resistance values for pairs of terminals specified by user input.

9. The method of claim 6, wherein point to point resistance values in the point to point resistance value table are generated using mesh and matrix analysis of the graph data structure.

10. The method of claim 6, wherein generating a point to point resistance value table includes at least one of determining the resistance from a source terminal to all destination terminals and determining the resistance from a source terminal to a single destination terminal.

11. The method of claim 6, wherein generating a point to point resistance value table includes:

generating a conductance matrix;

generating a current matrix;

determining a voltage matrix from the conductance matrix and the current matrix; and calculating a source to destination resistance value based on the voltage matrix.

12. A method, in a data processing system for generating a visual representation of a resistance network comprising:

receiving a cell layout for the resistance network;

extracting a resistance parasitic list from the cell layout;

generating a graph data structure from the resistance parasitic netlist; and generating a visual representation of the graph data structure, wherein generating a graph data structure from the resistance parasitic netlist includes;

determining, for each resistor connection of each resistor in the resistance parasitic netlist, whether the resistor connection is already exists in the graph data structure;

adding a new node to the graph data structure if the resistor connection does not already exist in the graph data structure; and adding an arc from a previous node to the new node.

13. A computer program product in a computer readable medium for generating a visual representation of a resistance network, comprising:

first instructions for receiving a cell layout for the resistance network;

second instructions for extracting a resistance parasitic netlist from the cell layout;

third instructions for generating a graph data structure from the resistance parasitic netlist; and fourth instructions for generating a visual representation of the graph data structure, wherein the visual representation includes graphical representations of terminals, graphical representations of nodes between resistance elements, and arcs representing the resistance elements.

14. The computer program product of claim 13, further comprising:

fifth instructions for reducing the graph data structure generated from the resistance parasitic values.

15. The computer program product of claim 14, wherein the fifth instructions for reducing the graph data structure include instructions for performing at least one of series and parallel reduction on the graph data structure for one or more layers of the cell layout.

16. The computer program product of claim 13, wherein the graphical representations of nodes between resistance values include shading or coloring, and wherein the shading or coloring is representative of a layer of the node in the cell layout.

17. The method of claim 13, wherein the arcs have displayed attributes that include a resistance value and a name that corresponds to a resistor element in the resistance parasitic netlist.

18. The computer program product in a computer readable medium for generating a visual representation of a resistance network, comprising:

first instructions for receiving a cell layout resistance network;

second instructions for extracting a resistance parasitic netlist from the cell layout;

third instructions for generating a graph data structure from the resistance parasitic netlist;

fourth instructions for generating a visual representation of the graph data structure; and fifth instructions for generating a point to point resistance value that stores resistance values for sets of terminals in cell layout.

19. The computer program product of claim 18, wherein the fifth instructions for generating a point to point resistance value table include instructions for generating resistance values for each possible pair of terminals in the cell layout.

20. The computer program product of claim 18, wherein the fifth instructions for generating a point to point resistance value table include instructions for generating resistance values for pairs of terminals specified by user input.

21. The computer program product of claim 18, wherein point to point resistance values in the point to point resistance value table are generated using mesh and matrix analysis of the graph data structure.

22. The computer program product of claim 18, wherein the fifth instructions for generating a point to point resistance value table include at least one of instructions for determining the resistance from a source terminal to all destination terminals and instructions for determining the resistance from a source terminal to a single destination terminal.

23. The computer program product of claim 18, wherein the fifth instructions for generating a point to point resistance value table include:

instructions for generating a conductance matrix;

instructions for generating a current matrix;

instructions for determining a voltage matrix from the conductance matrix and the current matrix; and instructions for calculating a source to destination resistance value based on the voltage matrix.

24. A computer program product in a computer readable medium for generating a visual representation of a resistance network, comprising:

first instructions for receiving a cell network;

second instructions for extracting a resistance parasitic netlist from the cell layout;

third instructions for generating a graph data structure from the resistance parasitic netlist; and fourth instructions for generating a visual representation of the graph data structure, wherein the third instructions for generating a graph data structure from the resistance parasitic values include:

instructions for determining, for each resistor connection of each resistor in the resistance netlist, whether the resistor connection is already exists in the graph data structure;

instructions for adding a new node to the graph data structure if the resistor connection does not already exist in the graph data structure; and instructions for adding an arc from a previous node to the new node.

25. An apparatus for generating a visual representation of a resistance network, comprising:

means for receiving a cell layout for the resistance network;

means for extracting a resistance parasitic netlist from the cell layout;

means for generating a graph data stnzcture from the resistance parasitic netlist; calculating a source to destination resistance value based on the voltage matrix.

* * * * *